United States Patent
Murayama

(10) Patent No.: US 9,129,884 B2
(45) Date of Patent: Sep. 8, 2015

(54) SOLDER BUMP JOINING STRUCTURE WITH LOW RESISTANCE JOINING MEMBER

(71) Applicant: SHINKO ELECTRIC INDUSTRIES CO., LTD., Nagano-ken (JP)

(72) Inventor: Kei Murayama, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 14/489,932

(22) Filed: Sep. 18, 2014

(65) Prior Publication Data

US 2015/0091162 A1    Apr. 2, 2015

(30) Foreign Application Priority Data

Oct. 2, 2013  (JP) .................................. 2013-207498

(51) Int. Cl.
*H01L 23/498* (2006.01)
*H01L 23/00* (2006.01)
*H01L 23/538* (2006.01)

(52) U.S. Cl.
CPC .............. *H01L 24/17* (2013.01); *H01L 23/498* (2013.01); *H01L 23/538* (2013.01); *H01L 2224/16054* (2013.01); *H01L 2224/16225* (2013.01); *H01L 2224/16503* (2013.01); *H01L 2224/16507* (2013.01); *H01L 2924/014* (2013.01); *H01L 2924/01028* (2013.01); *H01L 2924/01029* (2013.01); *H01L 2924/01046* (2013.01); *H01L 2924/01079* (2013.01); *H01L 2924/01083* (2013.01); *H01L 2924/1431* (2013.01); *H01L 2924/1432* (2013.01); *H01L 2924/1436* (2013.01); *H01L 2924/1437* (2013.01);

(Continued)

(58) Field of Classification Search
CPC ............ H01L 23/49827; H01L 23/538; H01L 23/498; H01L 24/17
USPC ................................................... 257/737, 779
See application file for complete search history.

(56) References Cited

U.S. PATENT DOCUMENTS

| 7,224,066 B2 | 5/2007 | Naruse et al. |
| 2005/0046032 A1 | 3/2005 | Naruse et al. |
| 2009/0085164 A1* | 4/2009 | Murayama et al. ........... 257/603 |

(Continued)

FOREIGN PATENT DOCUMENTS

| JP | 2005-95977 | 4/2005 |
| JP | 2013-93547 | 5/2013 |

*Primary Examiner* — Nathan Ha
(74) *Attorney, Agent, or Firm* — Fish & Richardson P.C.

(57) ABSTRACT

A semiconductor device is provided with a wiring substrate including a connection pad, a joining member joined with the connection pad, and a semiconductor chip including a connection terminal electrically connected to the connection pad via the joining member. The joining member consists of a first intermetallic compound layer formed at a boundary between the connection pad and the joining member, a second intermetallic compound layer formed at a boundary between the connection terminal and the joining member, a third intermetallic compound layer composed of an intermetallic compound of $Cu_6Sn_5$ or $(Cu,Ni)_6Sn_5$ and formed between the first intermetallic compound layer and the second intermetallic compound layer, and discrete metal grains, each being composed of a simple substance of Bi, in the third intermetallic compound layer. Surfaces of each of the metal grains are completely covered by the third intermetallic compound layer so that the metal grains do not form a layer.

6 Claims, 8 Drawing Sheets

(52) U.S. Cl.
CPC ............... *H01L2924/1438* (2013.01); *H01L 2924/20104* (2013.01)

(56) References Cited

U.S. PATENT DOCUMENTS

| | | | |
|---|---|---|---|
| 2009/0093117 A1* | 4/2009 | Taguchi et al. | 438/667 |
| 2009/0183911 A1* | 7/2009 | Sunohara et al. | 174/267 |
| 2011/0101526 A1* | 5/2011 | Hsiao et al. | 257/738 |
| 2012/0098123 A1* | 4/2012 | Yu et al. | 257/737 |
| 2012/0248176 A1* | 10/2012 | Herron et al. | 228/248.1 |
| 2013/0087912 A1 | 4/2013 | Shimizu et al. | |
| 2013/0134582 A1* | 5/2013 | Yu et al. | 257/737 |
| 2013/0223014 A1* | 8/2013 | Lin et al. | 361/728 |
| 2013/0284509 A1* | 10/2013 | Murayama et al. | 174/267 |
| 2014/0048929 A1* | 2/2014 | Cha et al. | 257/737 |
| 2014/0361070 A1* | 12/2014 | Cho | 228/249 |

* cited by examiner

Fig.3A
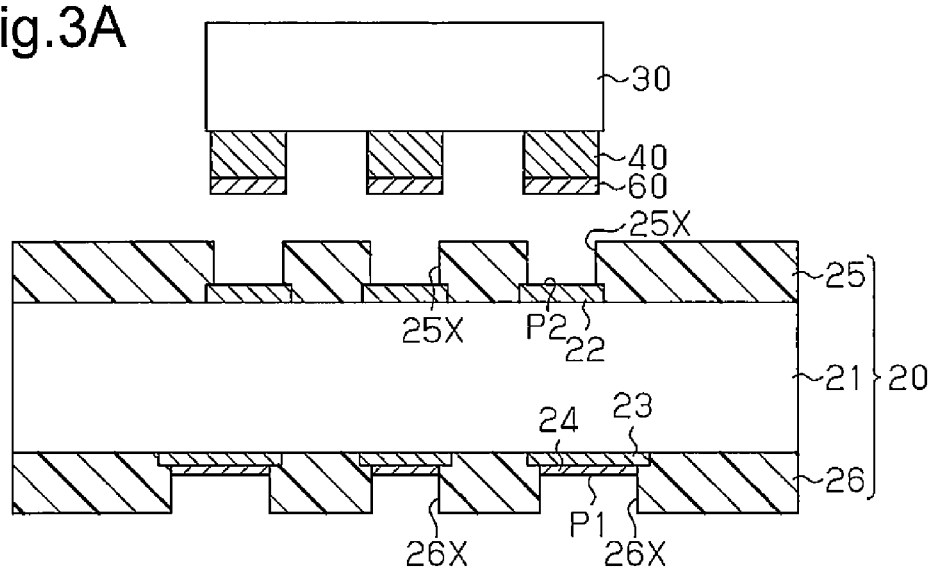
Fig.3B
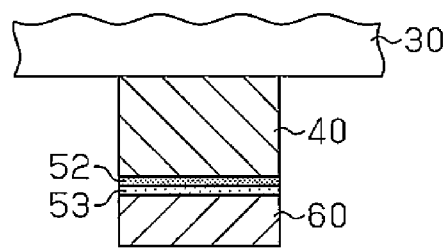
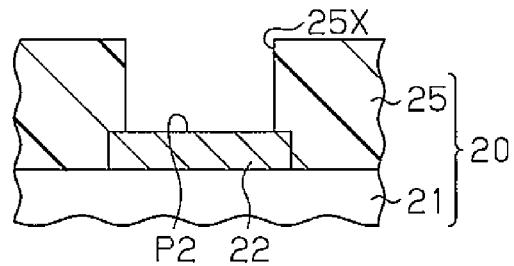
Fig.3C
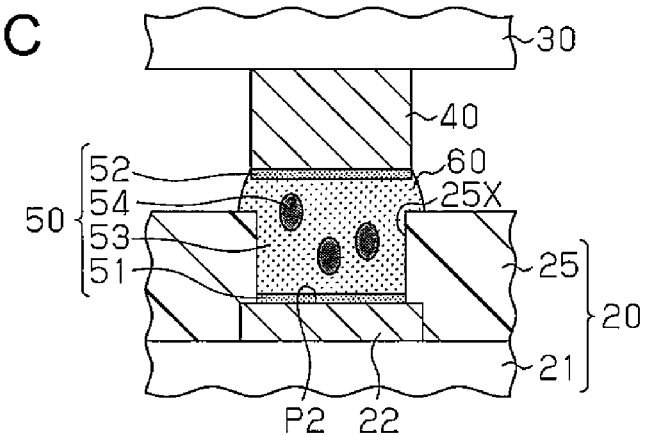

Fig.6A
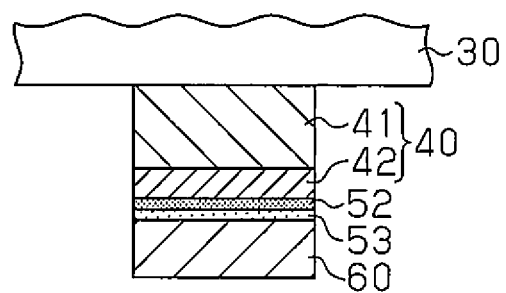
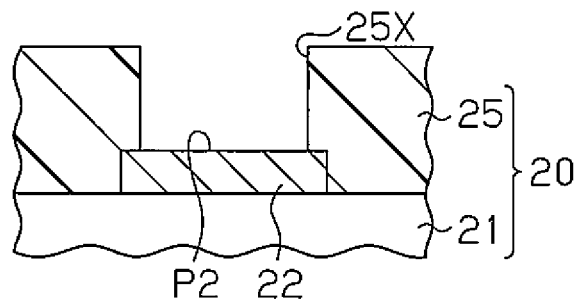
Fig.6B
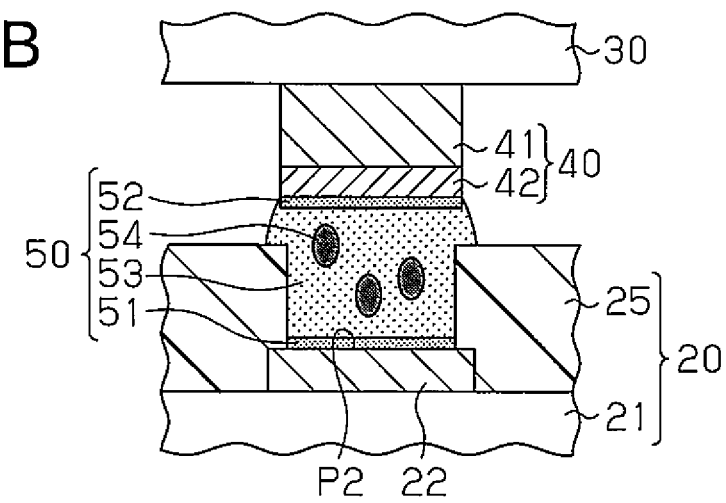

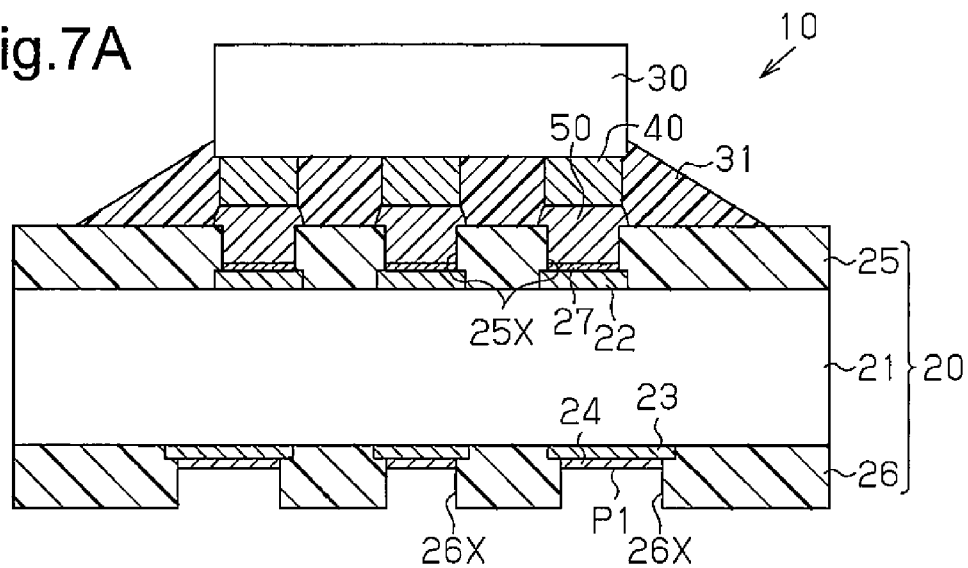
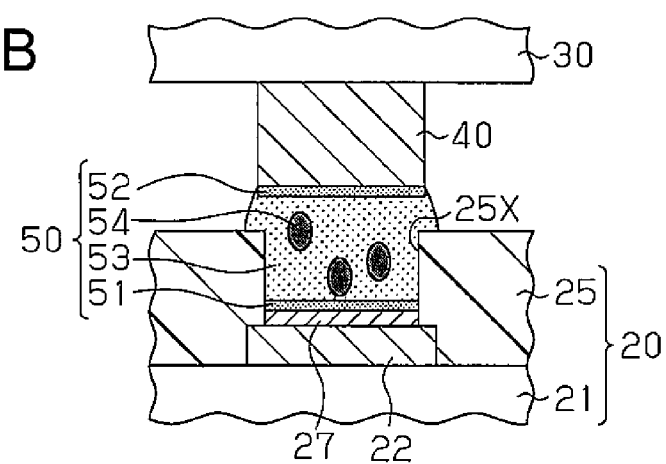

SOLDER BUMP JOINING STRUCTURE WITH LOW RESISTANCE JOINING MEMBER

CROSS-REFERENCE TO RELATED APPLICATIONS

This application is based upon and claims the benefit of priority from prior Japanese Patent Application No. 2013-207498, filed on Oct. 2, 2013, the entire contents of which are incorporated herein by reference.

FIELD

This disclosure relates to a semiconductor device.

BACKGROUND

A typical semiconductor device includes a wiring substrate and a semiconductor chip mounted on the wiring substrate. In the wiring substrate, for example, wiring layers and insulation layers are alternately stacked on a substrate body, which is composed of silicon. A via extends through each insulation layer to connect the adjacent upper and lower wiring layers. Japanese Laid-Open Patent Publication Nos. 2005-95977 and 2013-93547 describe examples of conventional semiconductor devices.

In a semiconductor device, for example, a connection pad is arranged on an outermost layer of a wiring substrate. A joining member such as a solder bump electrically connects the connection pad to an electrode pad of the semiconductor chip. Due to environmental concerns, lead-free solder, which does not include lead (Pb), is used as the joining member. For example, Sn—Bi solder, which has a relatively low melting point, may be used as the lead-free solder.

One example of a method for manufacturing a semiconductor device will now be described.

Referring to FIG. 9A, a solder bump 72 is formed on a connection pad 70P of a wiring substrate 70. For example, Sn-57Bi (melting point: 137° C.) is used as the solder bump 72. Then, the distal end of a connection terminal 81, which is formed on an electrode pad (not illustrated) of the semiconductor chip 80, contacts the solder bump 72. This arranges the semiconductor chip 80 on the wiring substrate 70 with the solder bump 72 located in between. The bump 72 is heated and melted in a reflow furnace. Then, the melted bump is solidified. As illustrated in FIG. 9B, this electrically connects the connection pad 70P of the wiring substrate 70 to the electrode pad of the semiconductor chip 80 via the solder bump 72 and the connection terminal 81.

When the solder bump 72 joins the connection pad 70P and the connection terminal 81, intermetallic compound layers 73 and 74 are formed at the boundary between the connection pad 70P and the solder bump 72, as illustrated in FIG. 9B. Further, intermetallic compound layers 75 and 76 are formed at the boundary between the connection terminal 81 and the solder bump 72. When the solder bump 72 has an Sn—Bi composition and the material of the connection pad 70P and the connection terminal 81 is copper (Cu), the intermetallic compound layers 73 and 75 are composed of an intermetallic compound of $Cu_3Sn$, and the intermetallic compound layers 74 and 76 are composed of an intermetallic compound of $Cu_6Sn_5$.

SUMMARY

The inventor of the present invention has performed studies and learned that the resistance at the portion joining the connection pad 70P and the connection terminal 81 increases when conducting a reliability test, such as an acceleration test, on a semiconductor device 90. For example, when the connection terminal 81 and the connection pad 70P are joined by the Sn—Bi solder bump 72 as illustrated in FIG. 9B, the acceleration test is conducted by placing the semiconductor device 90 under a high-temperature environment of approximately 120° C. to 130° C. As illustrated in FIG. 9C, under such a high-temperature environment, the Sn of the solder bump 72 reacts with the Cu dispersed from the connection pad 70P and the connection terminal 81 at the boundary between the connection pad 70P and the solder bump 72 and the boundary between the connection terminal 81 and the solder bump 72. This forms the intermetallic compound layers 73, 74, 75, and 76. Further, when the reaction of Sn and Cu advances and the generation of the intermetallic compound advances, the segregation of Bi forms a Bi layer 77 between, for example, the intermetallic compound layers 74 and 76. The resistance of the Bi is relatively high. The formation of a layer of Bi having high resistance in this manner increases the resistance at the joint of the connection pad 70P and the connection terminal 81.

One aspect of the present disclosure is a semiconductor device provided with a wiring substrate including a connection pad, a joining member joined with the connection pad, and a semiconductor chip including a connection terminal electrically connected to the connection pad via the joining member. The joining member consists of a first intermetallic compound layer composed of an intermetallic compound of $Cu_3Sn$ or $Ni_3Sn_4$ and formed at a boundary between the connection pad and the joining member, a second intermetallic compound layer composed of an intermetallic compound of $Cu_3Sn$ or $Ni_3Sn_4$ and formed at a boundary between the connection terminal and the joining member, a third intermetallic compound layer composed of an intermetallic compound of $Cu_6Sn_5$ or $(Cu,Ni)_6Sn_5$ and formed between the first intermetallic compound layer and the second intermetallic compound layer, and a simple substance of Bi separated and dispersed in the third intermetallic compound layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 3A to 3C are schematic cross-sectional views illustrating a method for manufacturing the semiconductor device illustrated in FIG. 1A;

FIGS. 6A and 6B are schematic cross-sectional views illustrating a method for manufacturing the semiconductor device illustrated in FIG. 5A;

FIG. 7A is a schematic cross-sectional view illustrating a modified example of a semiconductor device;

FIG. 7B is a partially enlarged cross-sectional view of the semiconductor device illustrated in FIG. 7A;

FIG. 8A is a BSE image, FIG. 8B is a phase diagram, and FIG. 8C is a Cu—Sn scatter diagram.

DESCRIPTION OF THE EMBODIMENTS

Various embodiments will now be described with reference to the accompanying drawings, which are illustrated for simplicity and clarity and have not necessarily been drawn to scale. In the cross-sectional drawings, components may be illustrated without hatching lines or be illustrated by shadings instead of hatching lines.

A first embodiment will now be described with reference to FIGS. 1A to 4.

Figure 1A:
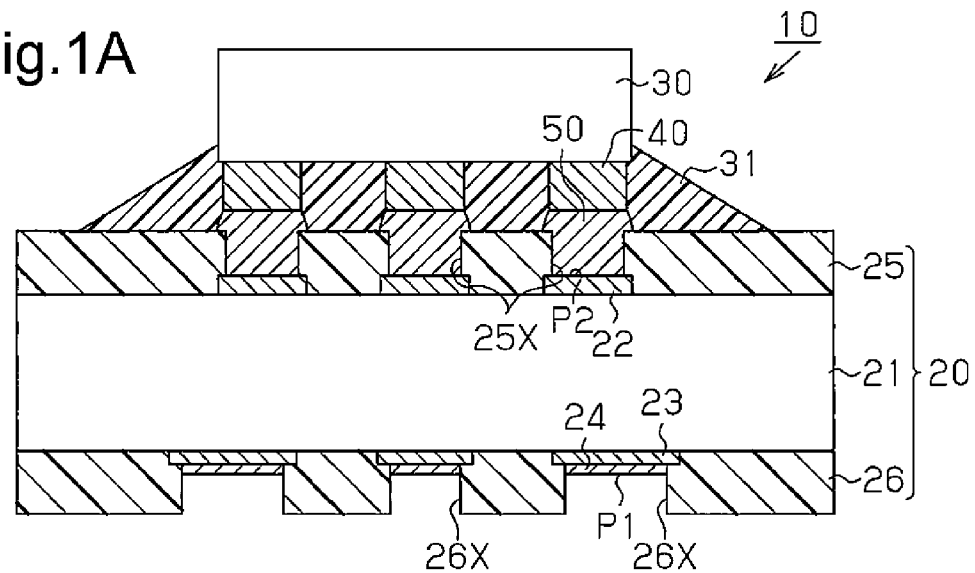
FIG. 1A is a schematic cross-sectional view illustrating a semiconductor device of a first embodiment.

As illustrated in FIG. 1A, the semiconductor device 10 includes a wiring substrate 20 and one or more semiconductor chips 30 mounted on the wiring substrate 20. A gap between the wiring substrate 20 and each semiconductor chip 30 is filled with an underfill resin 31.

The wiring substrate 20 includes a substrate body 21, a wiring pattern 22 located in the uppermost wiring layer, a wiring pattern 23 located in the lowermost wiring layer, and solder resist layers 25 and 26. Any structure may be employed as the substrate body 21 as long as the wiring pattern 22 and the wiring pattern 23 can be connected to each other through the substrate body 21. For example, wiring layers may be formed in the substrate body 21. In such a structure, two adjacent wiring layers are stacked with an interlayer insulation layer arranged in between, and a via formed in each wiring layer and a via formed in each insulation layer electrically connect the wiring pattern 22 and the wiring pattern 23. Further, a cored build-up substrate, which includes a core substrate, or a coreless substrate, which does not include a core substrate, may be used as the substrate body 21.

The wiring pattern 23 is arranged on the lower surface of the substrate body 21. External connection pads P1 are formed on the wiring pattern 23. External connection terminals (not illustrated), such as solder balls or lead pins, are connected to the external connection pads P1 and used when mounting the wiring substrate 20 on a mounting substrate such as a motherboard. The material of the wiring pattern 23 may be, for example, copper (Cu) or a copper alloy.

The solder resist layer 26 is arranged on the lower surface of the substrate body 21 so as to cover portions of the wiring pattern 23. In other words, the solder resist layer 26 includes openings 26X exposing portions of the wiring pattern 23. A metal layer 24 is formed on the wiring pattern 23 exposed from the openings 26X. Examples of the metal layer 24 includes a gold (AU) layer, a nickel (Ni) layer/Au layer (metal layer in which an Ni layer and an Au layer are stacked in this order on the lower surface of the wiring pattern 23), and an Ni/palladium (Pd)/Au layer (metal layer in which an Ni layer, a Pd layer, and an Au layer are stacked in this order on the lower surface of the wiring pattern 23). The metal layer 24 functions as the external connection pads P1. The metal layer 24 may be omitted, and portions of the wiring pattern 23 exposed from the openings 26X may be used as the external connection pads P1.

In lieu of the metal layer 24, an organic solderability preservative (OSP) film may be formed on the wiring pattern 23 exposed from the openings 26X. The OSP film is formed by performing an OSP process on the wiring pattern 23. In this case, the OSP film functions as the external connection pads P1 connected to external connection terminals. Further, the wiring pattern 23 exposed from the openings 26X may be used as the external connection terminals. Alternatively, the metal layer 24 or the OSP film formed on the wiring pattern 23 may be used as the external connection terminals.

The openings 26X and the external connection pads P1 (metal layer 24) are, for example, circular as viewed from above and have a diameter of, for example, approximately 100 to 1000 μm. A thickness from the lower surface of the wiring pattern 23 to the lower surface of the solder resist layer 26 may be, for example, approximately 15 to 30 μm. The material of the solder resist layer 26 may be, for example, an epoxy or acrylic insulative resin.

The wiring pattern 22 is arranged on a chip mounting area (upper surface as viewed in FIG. 1A) of the substrate body 21, which is the surface of the wiring substrate 20 on which the semiconductor chip 30 is mounted. The wiring pattern 22 includes connection pads P2 connected to connection terminals 40 of the semiconductor chip 30. The connection pads P2 are laid out in accordance with the layout of the connection terminals 40 of the semiconductor chip 30. The material of the wiring pattern 22 may be, for example, copper or a copper alloy.

The solder resist layer 25 is arranged on the upper surface of the substrate body 21 so as to cover portions of the wiring pattern 22. In other words, the solder resist layer 25 includes openings 25X exposing portions of the wiring pattern 22 as the connection pads P2.

The openings 25X and the connection pads P2 (metal layer 24) are, for example, circular as viewed from above and have a diameter of, for example, approximately 10 to 50 μm. A thickness from the upper surface of the wiring pattern 22 to the upper surface of the solder resist layer 25 may be, for example, approximately 3 to 30 μm. The material of the solder resist layer 25 may be, for example, an epoxy or acrylic insulative resin.

The semiconductor chip 30 includes a circuit formation surface (lower surface as viewed in FIG. 1A), on which a semiconductor integrated circuit (not illustrated) is formed, and the connection terminals 40, which are connected to the circuit formation surface. The semiconductor substrate is, for example, a thin substrate composed of silicon (Si). A protection film (not illustrated) covers the circuit formation surface of the semiconductor chip 30. The connection terminals 40 and joining members 50 electrically connect the semiconductor chip 30 to the connection pads P2 of the wiring substrate 20.

The semiconductor chip 30 is, for example, a logic chip, such as a central processing unit (CPU) chip or a graphics processing unit (GPU) chip, or a memory chip, such as a dynamic random access memory (DRAM) chip, a static random access memory (SRAM) chip, or a flash memory chip. When mounting more than one semiconductor chip 30 on the wiring substrate 20, a logic chip and a memory chip may be combined and mounted on the wiring substrate 20.

The dimensions of the semiconductor chip 30 may be, for example, approximately 3 mm×3 mm to 30 mm×30 mm as viewed from above. The thickness of the semiconductor chip 30 may be, for example, approximately 30 to 775 μm.

Each connection terminal 40 may be, for example, a rod-shaped metal post. The connection terminal 40 extends downward from the circuit formation surface of the semiconductor chip 30. The connection terminal 40 is, for example, cylindrical. Further, the connection terminal 40 may have a height of, for example, approximately 10 to 20 μm and a diameter of, for example, approximately 20 to 50 μm. Further, the pitch between adjacent connection terminals 40 may be, for example, approximately 25 to 200 μm. The material of the connection terminals 40 may be, for example, copper or a copper alloy. In addition to metal posts, for example, metal bumps may be used as the connection terminals 40.

The joining members 50 are joined with both of the connection pads P2 and the connection terminals 40. For example, the openings 25X of the solder resist layer 25 are filled with the joining members 50. For example, Sn—Bi solder, which has a relatively low melting point, may be used as the joining member 50. The height of each joining member 50, that is, the height from the upper surface of the wiring pattern 22 to the lower surface of the corresponding connection terminal 40, may be, for example, approximately 4 to 8 μm.

The gap between the upper surface of the wiring substrate 20 and the lower surface of the semiconductor chip 30 is filled with the underfill resin 31. The underfill resin 31 increases the connecting strength at portions connecting the connection terminals 40 and the connection pads P2. Further, the underfill resin 31 reduces corrosion of the wiring pattern 22 and the occurrence of electromigration. This obviates decreases in the reliability of the wiring pattern 22. The material of the underfill resin 31 may be, for example, an epoxy insulative resin.

The structure for joining the wiring pattern 22 (connection pads P2), the joining members 50, and the connection terminals 40 will now be described.

Figure 1B:
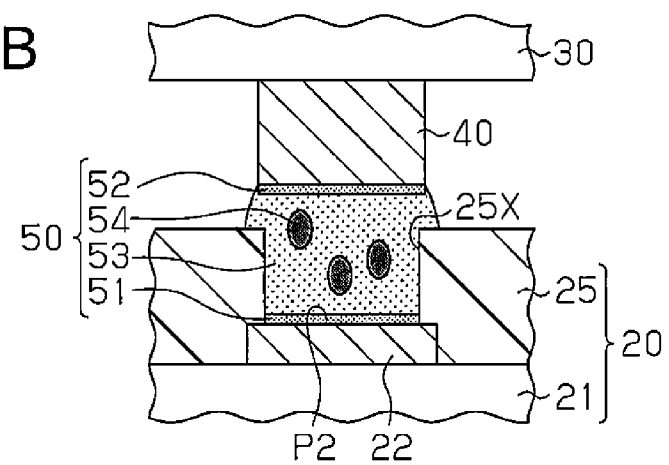
FIG. 1B is a partially enlarged cross-sectional view of the semiconductor device illustrated in FIG. 1A.

Referring to FIG. 1B, each joining member 50 includes an intermetallic compound layer 51 composed of an intermetallic compound of $Cu_3Sn$, an intermetallic compound layer 52 composed of an intermetallic layer of $Cu_3Sn$, an intermetallic compound layer 53 composed of an intermetallic compound layer of $Cu_6Sn_5$, and metal bodies 54 each composed of a simple substance of Bi (Bismuth).

The intermetallic compound layer 51 is formed at the boundary (joining boundary) between the connection pad P2 and the joining member 50, that is, the portion joining the connection pad P2 and the joining member 50. In other words, the intermetallic compound layer 51 substantially joins the connection pad P2 and the joining member 50. For example, the intermetallic compound layer 51 entirely covers the upper surface of the wiring pattern 22 (connection pad P2) exposed from the corresponding opening 25X of the solder resist layer 25. The intermetallic compound layer 51 may have a thickness of, for example, 0.5 to 5 μm.

The intermetallic compound layer 52 is formed at the boundary (joining boundary) between the connection terminal 40 and the joining member 50, that is, the portion joining the connection terminal 40 and the joining member 50. In other words, the intermetallic compound layer 52 substantially joins the connection terminal 40 and the joining member 50. For example, the intermetallic compound layer 52 entirely covers the lower surface of the connection terminal 40. The intermetallic compound layer 52 may have a thickness of, for example, 0.5 to 5 μm.

The intermetallic compound layer 53 is formed between the intermetallic compound layers 51 and 52 and connects the intermetallic compound layer 51 and the intermetallic compound layer 52. It may be difficult to clearly distinguish the locations of the intermetallic compound layers 51 to 53. For example, the intermetallic compound layer 53 may exist at the boundary between the connection pad P2 and the joining member 50 or the boundary between the connection terminal 40 and the joining member 50. In this manner, the joining member 50 between the connection pad P2 and the connection terminal 40 is formed by the intermetallic compound layers 51 to 53. That is, metal bodies composed of a simple substance of Sn do not exist in the joining member 50, and an intermetallic compound of $Cu_3Sn$ and an intermetallic compound of $Cu_6Sn_5$ exist in the joining member 50.

The metal bodies 54, each of which is composed of the simple substance of Bi, are separately dispersed in the intermetallic compound layer 53. That is, the metal bodies 54 are grains that do not form a layer in the intermetallic compound layer 53. At least a portion of the surface of each metal body 54 is covered by the intermetallic compound layer 53. Most of the metal bodies 54 are surrounded by the intermetallic compound layer 53. The average grain diameter of the metal bodies 54 may be, for example, approximately 2 to 10 μm.

In this manner, the joining member 50 does not include metal bodies (metal layer or the separately dispersed metal grains) composed of the simple substance of Sn and includes only the intermetallic compound layers 51 to 53, which are composed of intermetallic compounds of Sn and Cu, and the metal bodies 54 each composed of the simple substance of Bi.

Figure 2:
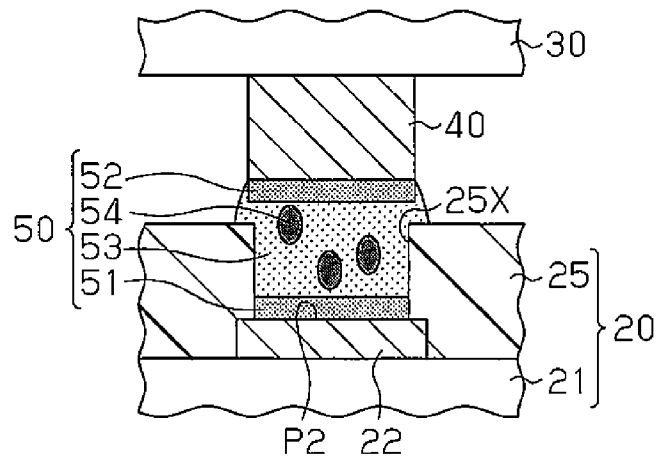
FIG. 2 is a partially enlarged cross-sectional view illustrating the operation of the semiconductor device illustrated in FIG. 1A.

The operation of the semiconductor device 10 will now be described with reference to FIGS. 1B and 2.

The joining member 50, which joins the connection pad P2 of the wiring substrate 20 and the connection terminal 40 of the semiconductor chip 30, is formed by the intermetallic compound layers 51 to 53, which are composed of intermetallic compounds of Sn and Cu, and the metal bodies 54 each composed of the simple substance of Bi. Further, the intermetallic compound layers 51 to 53, which are composed of intermetallic compounds of Sn and Cu, entirely or partially covers the surface of each metal body 54. In other words, the intermetallic compounds of $Cu_3Sn$ or $Cu_6Sn_5$ are formed around the simple substance of Bi before a layer of segregated Bi forms. Further, the simple substance of Sn does not exist in the joining member 50.

Consequently, even when a reliability test such as an acceleration test is conducted on the semiconductor device 10 under a high-temperature environment (e.g., under a temperature of 120° C. to 130° C.), Bi is not segregated in the joining member 50, and the formation of a layer of the metal bodies 54 (Bi) is inhibited. This is because the joining member 50 does not include the simple substance of Sn that has already reacted with the Cu dispersed from the connection pad P2 and the connection terminal 40 to form the intermetallic compound layers 51 to 53. Accordingly, changes in the resistance of the joining member 50 are limited, and increases in the resistance of the joining member 50 are limited. When the semiconductor device 10 is placed in a high-temperature environment, some of the $Cu_6Sn_5$ changes to $Cu_3Sn$. Thus, as illustrated in FIG. 2, after being placed under a high temperature, in the joining member 50, the intermetallic compound layers 51 and 52 become thicker than before being placed under a high temperature (refer to FIG. 1B).

A method for manufacturing the semiconductor device 10 will now be described.

Referring to FIG. 3A, the wiring substrate 20 is first prepared. The wiring substrate 20 may be manufactured through a known method, which will now be briefly described.

First, the wiring pattern 22 is formed on the upper surface of the substrate body 21, and the wiring pattern 23 is formed on the lower surface of the substrate body 21. The wiring patterns 22 and 23 may be formed, for example, by performing any of a variety of wiring formation processes such as a semi-additive process or a subtractive process. Then, the solder resist layer 25, which includes the openings 25X that expose portions of the wiring pattern 22 as the connection pads P2, is formed on the upper surface of the substrate body 21. Further, the solder resist layer 26, which includes the openings 26X that expose portions of the wiring pattern 23 and define regions of the external connection pads P1, are formed on the lower surface of the substrate body 21. Subsequently, for example, electroless plating is performed to form the metal layer 24 on the external connection pads P1.

In the step illustrated in FIG. 3A, the semiconductor chip 30, which includes the rod-shaped connection terminals 40, is prepared. The connection terminals 40 may be manufactured through a known method. An example of a method for manufacturing the semiconductor chip 30 will now be briefly described.

First, a protection film, which includes openings that expose electrode pads, is formed on the circuit formation surface (lower surface in this case) of the semiconductor chip 30. Then, a seed layer is formed to cover the lower surface of the protection film and the lower surface of each electrode pad. Further, a resist layer is formed including openings that expose the seed layer at locations where the connection terminals 40 are connected, that is, locations corresponding to the lower surfaces of the electrode pads. Subsequently, electrolytic plating is performed using the seed layer exposed from the openings of the resist layer as a power supplying layer to form the rod-shaped connection terminals 40 on the electrode pads.

Then, a solder plating layer 60 is formed on the lower surfaces of the connection terminals 40. The solder plating layer 60 may be formed by performing, for example, electrolytic solder plating using the resist layer as a mask and the seed layer as a power supplying layer. The electrolytic plating applies solder to the lower surface of each connection terminal 40. Then, the unnecessary seed layer and resist layer are removed. The structure illustrated in FIG. 3A may be obtained through such a manufacturing process.

The solder plating layer 60 may be, for example, Sn—Bi solder plating having a relatively low melting point. For example, Sn-57Bi (melting point: approximately 137° C.) may be used as the composition of the solder plating layer 60. As illustrated in FIG. 3B, the application of the solder plating layer 60, which is composed of Sn-57Bi, to the lower surface of each connection terminal 40, which is composed of Cu, forms the intermetallic compound layer 52, which is composed of an intermetallic compound of $Cu_3Sn$, and the intermetallic compound layer 53, which is composed of the intermetallic compound of $Cu_6Sn_5$, at the boundary between the connection terminal 40 and the solder plating layer 60. For example, the intermetallic compound layer 52 covers the lower surface of the connection terminal 40, and the intermetallic compound layer 53 covers the lower surface of the intermetallic compound layer 52. The solder plating layer 60 covers the lower surface of the intermetallic compound layer 53. Here, the intermetallic compound layer 52 may have a thickness of, for example, approximately 0.5 to 2 μm. The intermetallic compound layer 53 may have a thickness of, for example, approximately 0.5 to 2 μm. Further, the solder plating layer 60 may have a thickness of, for example, approximately 5 to 12 μm.

Referring to FIGS. 3A and 3B, the wiring substrate 20 and the semiconductor chip 30 are relatively positioned. More specifically, the surface (upper surface in this case) of each connection pad P2 of the wiring substrate 20 is positioned to oppose the surface (lower surface in this case) of the solder plating layer 60 arranged on the corresponding connection terminal 40 of the semiconductor chip 30.

Then, in the step illustrated in FIG. 3C, the connection terminal 40 of the semiconductor chip 30 is flip-chip-joined with the connection pad P2 of the wiring substrate 20. For example, after the wiring substrate 20 and the semiconductor chip 30 are positioned, a reflow process is performed to melt the solder plating layer 60. This electrically connects the connection terminal 40 to the connection pad P2. In the reflow process, heating is performed, for example, at a higher temperature than the melting point (137° C. in this case) of the solder plating layer 60 (Sn-57Bi solder plating in this case). In the reflow process, the heating is performed until all of the Sn in the solder plating layer 60 is used to form intermetallic compounds. For example, in the reflow process, heating is performed until all of the Sn in the solder plating layer 60 reacts with the metal elements (Cu in this case) dispersed from the connection terminal P2 and the connection terminal 40 into the solder plating layer 60 and forms intermetallic compounds. In the reflow process of the present embodiment, heating is performed until all of the Sn in the solder plating layer 60 reacts with Cu and forms the intermetallic compounds of $Cu_6Sn_5$ or $Cu_3Sn$. In other words, in the reflow process, heating is performed until metal bodies composed of the simple substance of Sn are eliminated from the portion joining the connection terminal 40 and the connection pad P2. Further, in the reflow process, heating is performed at a temperature (e.g., 175° or higher) that is sufficiently higher than the melting point of the solder plating layer 60 to enhance the generation of intermetallic compounds with the Sn in the solder plating layer 60 before Bi segregates from the solder plating layer 60 and forms a layer.

The reflow process described above forms the intermetallic compound layer 51, which is composed of the intermetallic compound of $Cu_3Sn$, at the boundary between the connection pad P2 and the solder plating layer 60 and the intermetallic compound layer 52 at the boundary between the connection terminal 40 and the solder plating layer 60. Further, the intermetallic compound layer 53 composed of the intermetallic compound of $Cu_6Sn_5$ is formed between the intermetallic compound layer 51 and the intermetallic compound layer 52. Here, most of the Bi in the solder plating layer 60 forms metal bodies 54 each composed of the simple substance of Bi. The metal bodies 54 are surrounded by the intermetallic compound layer 53. In other words, the reflow process forms the intermetallic compound layer 53 that entirely covers the surfaces of the metal bodies 54. This step forms the joining member 50, which includes the intermetallic compound layers 51 to 53 and the metal bodies 54 dispersed in the intermetallic compound layer 53, between the connection terminal 40 and the connection pad P2. The joining member 50 joins the connection terminal 40 and the connection pad P2.

One example of the heating conditions (temperature profile) in the reflow process will now be described.

Figure 4:
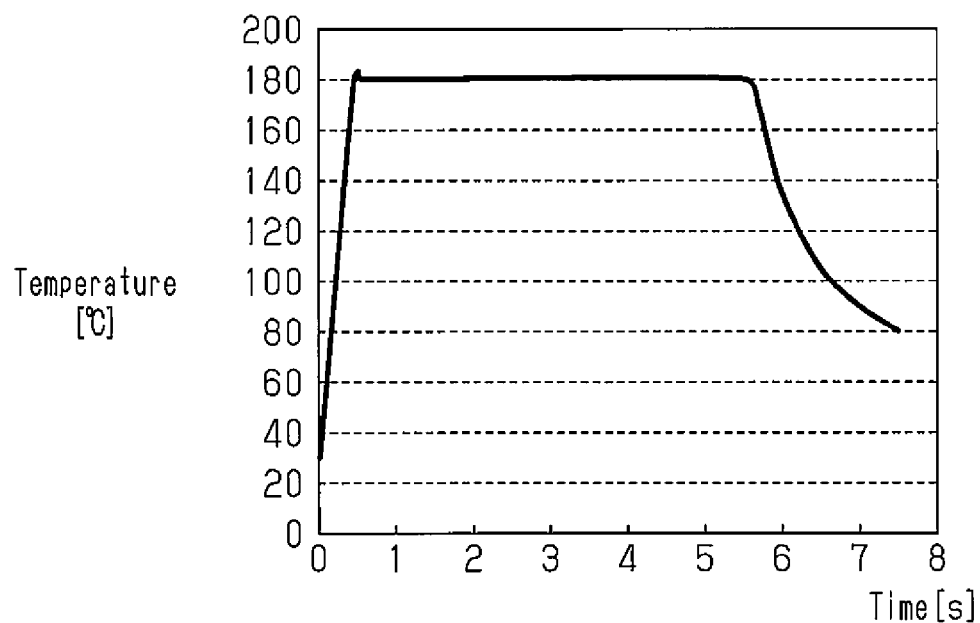
FIG. 4 is a graph illustrating a temperature profile of a reflow process.

Referring to FIG. 4, in the reflow process, the temperature is suddenly increased from room temperature to 180° C. in approximately thirty seconds from immediately after when the reflow process is started. Then, heating is performed for five seconds at 180° C. In this manner, immediately after the reflow process is started, the solder plating layer 60 is suddenly heated from the solid phase range to the liquid phase range, and the heating is performed over a relatively long time (in this case, five seconds) at a temperature (180° C.) that is sufficiently higher than the melting point (137° C.) of the solder plating layer 60. This allows all of the Sn in the solder plating layer 60 to react with Cu and allows all of the Sn to be transformed to an intermetallic compound of Sn and Cu. In this example, the solder plating layer 60 is thin (approximately 5 to 12 μm), and the amount of Sn is small in the solder plating layer 60. Thus, by performing heating for five seconds at 180° C., all of the Sn may be consumed to generate the intermetallic compound layers 51 to 53. After performing heating for five seconds, the temperature is decreased from 180° C. to 80° C. (temperature lower than the melting point of the solder plating layer 60) in approximately two seconds.

The manufacturing steps described above electrically connects the connection terminals 40 of the semiconductor chip 30 with the connection pads P2 of the wiring substrate 20 through the joining members 50, and flip-chip-joins the semiconductor chip 30 with the wiring substrate 20.

The gap between the wiring substrate 20 and the semiconductor chip 30 is filled with the underfill resin 31, which is in a liquid form. Then, the underfill resin 31 is solidified. For example, the underfill resin 31 is preheated to a temperature of approximately 100° C. and then cured (thermally cured) at approximately 150° C. for two hours and solidified. The manufacturing steps described above obtain the semiconductor device 10 of the present embodiment.

The advantages of the first embodiment will now be described.

(1) The joining member 50 for joining the connection pad P2 and the connection terminal 40 is formed by the intermetallic compound layers 51 to 53, each of which is composed of intermetallic compounds of Sn and Cu, and the metal bodies 54 each composed of the simple substance of Bi. Further, the surfaces of the metal bodies 54 are entirely covered by intermetallic compounds of Sn and Cu. This limits increases in the resistance of the joining member 50 even when the semiconductor device 10 undergoes, for example, a reliability test such as an acceleration test.

(2) Intermetallic compounds having a high melting point are formed at the portion joining the connection pad P2 and the connection terminal 40. This increases the heat resistance at the joining portion. Thus, at a high temperature, the connection reliability of the connection pad P2 (wiring substrate 20) and the connection terminal 40 (semiconductor chip 30) may be improved. The melting point of the intermetallic compound of $Cu_3Sn$ is 676° C., and the melting point of the intermetallic compound of $Cu_6Sn_5$ is 415° C.

Figure 9A:
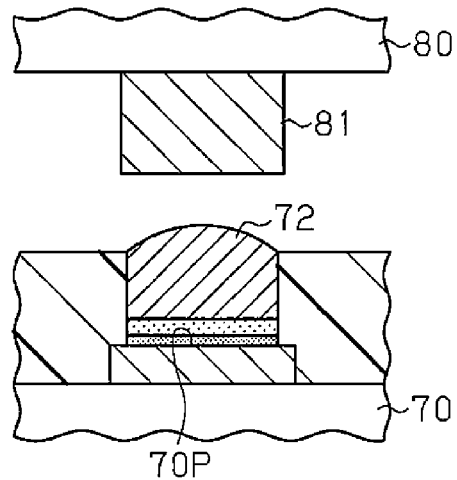
FIG. 9A to 9C are schematic cross-sectional views illustrating a semiconductor device of a related art.
Figure 9B:
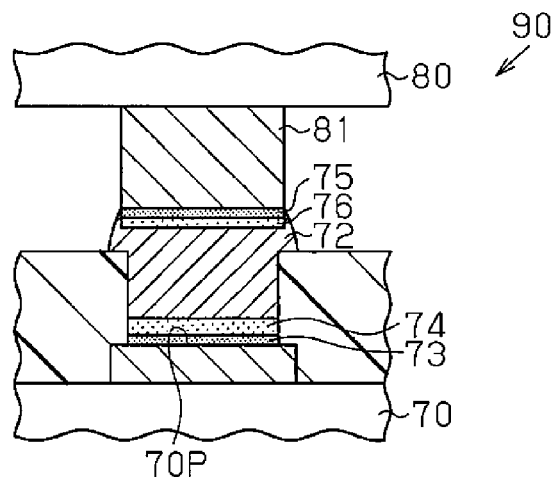
Figure 9C:
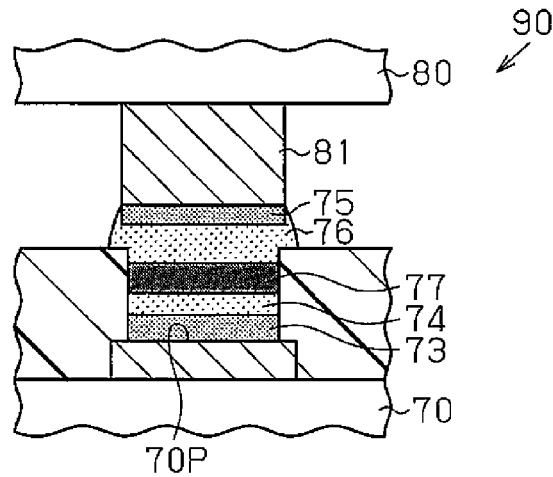

(3) Like in the related art illustrated in FIGS. 9A to 9C, when, for example, an intermetallic compound of Sn—Cu is formed at a boundary between the solder bump 72, which is composed of Sn-57Bi, and the connection pad 70P, which is composed of Cu, and the semiconductor device 90 is then left under a high temperature, the difference in the dispersion speed of Cu and Sn produces a large number of Kirkendall voids at the interface of Cu and $Cu_3Sn$. Further, the Kirkendall voids may cause fractures at the boundary between Cu (e.g., connection pad 70P or connection terminal 81) and $Cu_3Sn$ (e.g., intermetallic compound layers 73 and 75).

In contrast, in the present embodiment, all of the simple substance of Sn existing in the solder plating layer 60 is consumed by the formation of the intermetallic compounds of $Cu_3Sn$ and $Cu_6Sn_5$. Accordingly, metal bodies composed of Sn do not exist in the joining portion (joining member 50). Thus, there is virtually no movement of Sn from the joining member 50 to the connection pad P2 or the connection terminal 40. Accordingly, the growth of Kirkendall voids at the boundary between Cu (e.g., connection pad P2 or connection terminal 40) and $Cu_3Sn$ (e.g., intermetallic compound layers 51 and 52) may be suppressed. Further, the electro-migration resistance may be improved.

A second embodiment will now be described with reference to FIGS. 5A to 6B. Same reference numerals are given to those components that are the same as the corresponding components of the first embodiment. Such components will not be described in detail.

Figure 5A:
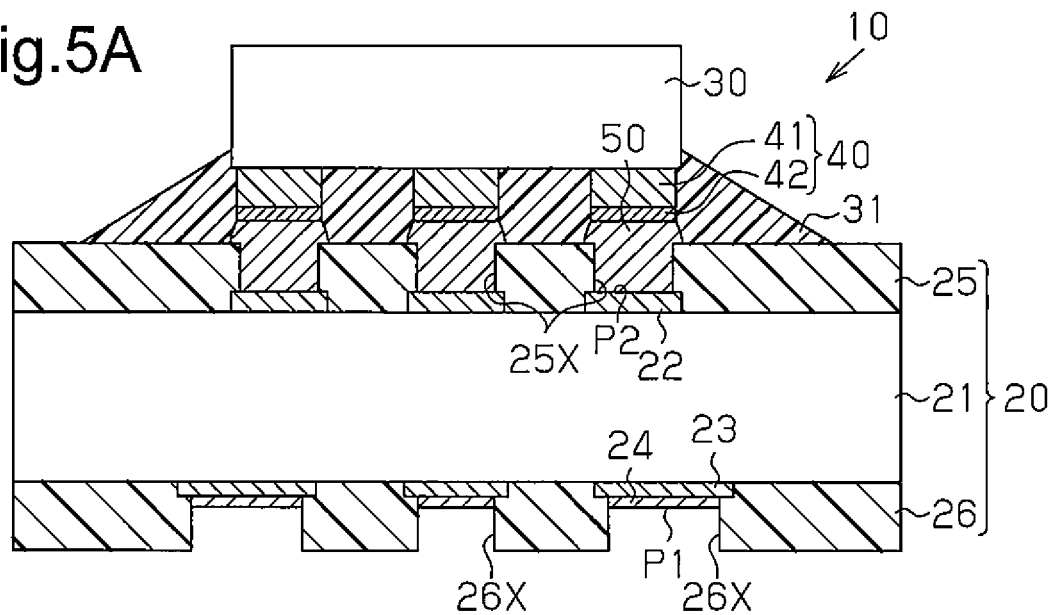
FIG. 5A is a schematic cross-sectional view illustrating a semiconductor device of a second embodiment.

As illustrated in FIG. 5A, the connection terminals 40 are formed on the circuit formation surface (lower surface as viewed in FIG. 5A) of the semiconductor chip 30. Each connection terminal 40 includes a metal post 41 and a metal layer 42. The metal post 41 is a rod-shaped connection terminal extending downward from the circuit formation surface of the semiconductor chip 30. The metal post 41 is, for example, cylindrical. Such a metal post 41 may have a height of, for example, 10 to 20 μm. The material of the metal post 41 may be, for example, copper or a copper alloy.

The metal layer 42 entirely covers the lower surface (first surface) of the metal post 41. The metal layer 42 may be, for example, an Ni layer. Other examples of the metal layer 42 include an Ni/Au layer (metal layer in which an Ni layer and an Au layer are stacked in this order on the lower surface of the metal post 41) and an Ni/Pd/Au layer (metal layer in which an Ni layer, a Pd layer, and an Au layer are stacked in this order on the lower surface of the metal post 41). The Ni layer, the Au layer, and the Pd layer may each be, for example, an electrolytic plating metal layer formed by performing electrolytic plating. The Ni layer is a metal layer composed of Ni or an Ni alloy. The Au layer is a metal layer composed of Au or an Au alloy. The Pd layer is a metal layer composed of Pd or a Pd alloy. When the metal layer 42 is an Ni layer, the metal layer 42 (Ni layer) may have a thickness of approximately 1 to 3 μm.

The connection terminal 40 (metal post 41 and metal layer 42) may have a diameter of, for example, approximately 20 to 50 μm. Further, the pitch between adjacent connection terminals 40 may be, for example, approximately 25 to 100 μm.

Figure 5B:
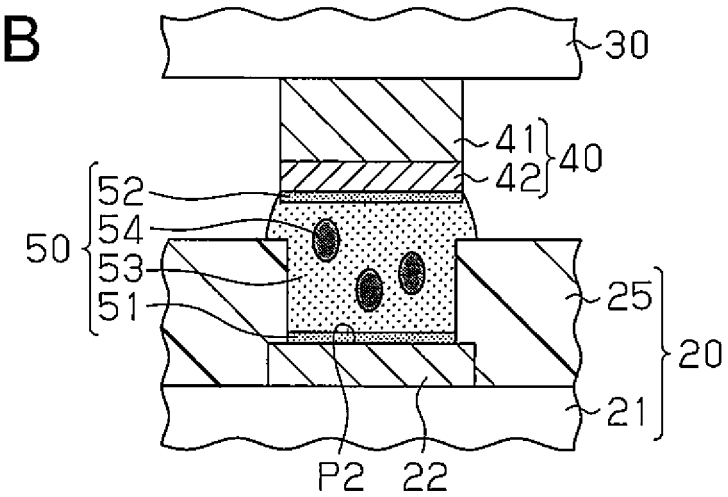
FIG. 5B is a partially enlarged cross-sectional view of the semiconductor device illustrated in FIG. 5A.

As illustrated in FIG. 5B, each joining member 50 includes the intermetallic compound layer 51, the intermetallic compound layer 52, the intermetallic compound layer 53, and the metal bodies 54 each composed of the simple substance of Bi.

The intermetallic compound layer 51 is formed at the boundary between the connection pad P2 and the joining member 50. The intermetallic compound layer 51 is composed of, for example, an intermetallic compound of $Cu_3Sn$. The intermetallic compound layer 52 is formed at the boundary between the metal layer 42 of the connection terminal 40 and the joining member 50. The intermetallic compound layer 52 substantially joins the metal layer 42 (connection terminal 40) and the joining member 50. The intermetallic compound layer 52, for example, entirely covers the lower surface of the metal layer 42. The intermetallic compound layer 52 is composed of, for example, an intermetallic compound of $Cu_3Sn$ or $Ni_3Sn_4$. The intermetallic compound layer 53 is formed between the intermetallic compound layers 51 and 52. The intermetallic compound layer 53 is composed of, for example, an intermetallic compound of $(Cu,Ni)_6Sn_5$.

A method for manufacturing the semiconductor device 10 of the second embodiment will now be described.

Referring to FIG. 6A, the semiconductor chip 30 that includes the connection terminals 40 is prepared. First, a protection film, which includes openings that expose electrode pads, is formed on the circuit formation surface of the semiconductor chip 30. Then, a seed layer is formed to cover the lower surface of the protection film and the lower surface of each electrode pad. Further, a resist layer is formed including openings that expose the seed layer at locations where the connection terminals 40 are connected, that is, locations corresponding to the lower surfaces of the electrode pads. Subsequently, electrolytic plating is performed using the seed layer exposed from the openings of the resist layer as a power supplying layer to form the rod-shaped metal posts 41 on the electrode pads.

Then, the metal layer 42 is formed entirely covering the lower surface of each metal post 41. The metal layer 42 may be formed by performing, for example, electrolytic plating (e.g., electrolytic Ni plating) using the resist layer as a mask and the seed layer as a power supplying layer.

Subsequently, the solder plating layer 60 is formed on the lower surface of the metal layer 42. The solder plating layer 60 may be formed by performing, for example, electrolytic solder plating using the resist layer as a mask and the seed layer as a power supplying layer. The electrolytic solder plating applies solder to the lower surface of the metal layer 42. Then, the unnecessary seed layer and resist layer are removed.

For example, Sn-57Bi may be used as the composition of the solder plating layer 60. The application of the solder plating layer 60, which is composed of Sn-57Bi, to the lower surface of each connection terminal 40, which is formed by the metal layer 42 (Ni layer) and the metal post 41 (Cu layer), forms the intermetallic compound layer 52 and the intermetallic compound layer 53 at the boundary between the metal layer 42 and the solder plating layer 60. For example, at the boundary between the metal layer 42 and the solder plating layer 60, the intermetallic compound layer 52 composed of an intermetallic compound of $Cu_3Sn$ or $Ni_3Sn_4$ is formed at a location proximate to the metal layer 42, and the intermetallic compound layer 53 composed of the intermetallic compound of $(Cu,Ni)_6Sn_5$ is formed at a location proximate to the solder plating layer 60. However, it may be difficult to clearly distinguish the locations of the intermetallic compound layers 52 and 53.

In the step illustrated in FIG. 6B, each connection terminal 40 of the semiconductor chip 30 is flip-chip-joined with the corresponding connection pad P2 of the wiring substrate 20. For example, after the wiring substrate 20 and the semiconductor chip 30 are positioned, a reflow process is performed to melt the solder plating layer 60. This electrically connects the connection terminal 40 to the connection pad P2. Referring to FIG. 4, in the reflow process, the temperature is suddenly increased from room temperature to 180° C. in approximately thirty seconds from immediately after when the reflow process is started. Then, heating is performed for five seconds at 180° C. This forms the joining member 50, which includes the intermetallic compound layers 51 to 53 and the metal bodies 54, between the connection terminal 40 (metal layer 42) and the connection pad P2. The joining member 50 joins the connection terminal 40 and the connection pad P2.

The gap between the wiring substrate 20 and the semiconductor chip 30 is filled with the underfill resin 31, which is in a liquid form. Then, for example, the underfill resin 31 is preheated to a temperature of approximately 100° C. and cured at approximately 150° C. for two hours and solidified. The manufacturing steps described above obtain the semiconductor device 10 of the second embodiment.

The second embodiment has the same advantages as the first embodiment.

It should be apparent to those skilled in the art that the present invention may be embodied in many other specific forms without departing from the spirit or scope of the invention. Particularly, it should be understood that the present invention may be embodied in the following forms.

As illustrated in FIGS. 7A and 7B, a metal layer 27 may be formed on the wiring pattern 22, which is used as the connection pads P2 (refer to FIGS. 1B and 5B) in each of the above embodiments. For example, the metal layer 27 entirely covers the upper surface of the wiring pattern 22 exposed from the openings 25X of the solder resist layer 25. Examples of the metal layer 27 include an Au layer, an Ni/Au layer (metal layer in which an Ni layer and an Au layer are stacked in this order on the upper surface of the wiring pattern 22), and an Ni/Pd/Au layer (metal layer in which an Ni layer, a Pd layer, and an Au layer are stacked in this order on the upper surface of the wiring pattern 22). In this case, the metal layer 27 functions as the connection pad. The Ni layer, the Au layer, and the Pd layer may each be, for example, an electroless plating metal layer formed by performing electroless plating.

As illustrated in FIG. 7B, the intermetallic compound layer 51 is formed at the boundary between the metal layer 27 and the joining member 50. The intermetallic compound layer 51 substantially joins the metal layer 27 and the joining member 50. For example, the intermetallic compound layer 51 entirely covers the upper surface of the metal layer 27. The intermetallic compound layer 51 is composed of, for example, an intermetallic compound of $Cu_3Sn$ or $Ni_3Sn_4$. The intermetallic compound layer 52 is formed at the boundary between the connection terminal 40 and the joining member 50. The intermetallic compound layer 52 is composed of, for example, an intermetallic compound of $Cu_3Sn$. The intermetallic compound layer 53 is formed between the intermetallic compound layer 51 and the intermetallic compound layer 52. The intermetallic compound layer 53 is composed of, for example, an intermetallic compound of $(Cu,Ni)_6Sn_5$.

In each of the above embodiments, the composition of the solder plating layer 60 is Sn-57Bi. However, as long as the solder plating layer 60 is an Sn—Bi solder, the composition of the solder plating layer 60 is not particularly limited. When increasing the content of Bi, the content of Sn decreases. This allows the heating time to be shortened in the reflow process. Further, the use of a composition having a lower melting point for the solder plating layer 60 allows the joining (soldering) of the connection pad P2 and the connection terminal 40 to be performed at a low temperature.

At least one of the metals of, for example, antimony (Sb), zinc (Zn), and Ni may be added as an additive to the solder plating layer 60.

In each of the above embodiments, the solder plating layer 60 is formed on the lower surface of the connection terminal 40. The solder plating layer 60 is melted and solidified to join the connection pad P2 and the connection terminal 40. Instead, for example, a solder bump may be formed on the connection pad P2, and the solder bump may be melted and solidified to join the connection pad P2 and the connection terminal 40. In this case, preferably, the diameter of the solder bump, which serves as the joining member, is decreased, and the content of Sn is decreased.

As long as the composition of the intermetallic compound layers 51 to 53 in each of the above embodiments is an intermetallic compound including Sn, the composition is not particularly limited.

The structure of the joining member 50 in each of the above embodiments is not particularly limited. For example, the intermetallic compound layers 51 and 52 may be omitted. That is, the joining member 50 may be a structure formed by the intermetallic compound layer 53, which is composed of the intermetallic compound of $Cu_6Sn_5$ or $(Cu,Ni)_6Sn_5$, and the metal bodies 54, each of which is composed of the simple substance of Bi.

In each of the above embodiments, the solder resist layer 25 may be omitted.

In the first embodiment, the connection terminal 40 does not have to be a metal post. That is, the connection terminal 40 does not have to be rod-shaped.

Example 1

The structure illustrated in FIG. 6 was prepared by arranging the connection terminal 40, which includes the metal post 41 and the metal layer 42, on the circuit formation surface (lower surface in this case) of the semiconductor chip 30, and arranging the solder plating layer 60 on the lower surface of the connection terminal 40 (metal layer 42). The thickness of the metal post 41 was 10 μm, the thickness of the metal layer 42 was 2 μm, the thickness of the solder plating layer 60 was 8 μm, and the diameter of the connection terminal 40 (metal post 41 and metal layer 42) was 25 μm. Further, the composition of the metal post 41 was Cu, the composition of the metal layer 42 was Ni, and the composition of the solder plating layer 60 was Sn-57Bi.

The connection terminal 40 of the semiconductor chip 30 was flip-chip-joined with a connection pad P2, which had a thickness of 15 μm and a diameter of 30 μm, through the same method as the manufacturing method of the second embodiment. More specifically, a reflow process was performed with the connection pad P2 opposed to the connection terminal 40 to melt the solder plating layer 60. In the reflow process, as illustrated in FIG. 4, the temperature was suddenly increased from room temperature to 180° C. in approximately thirty seconds from immediately after when the reflow process was started. Then, the solder plating layer 60 was heated for five seconds at 180° C. The composition of the connection pad P2 was Cu.

Figure 8A:
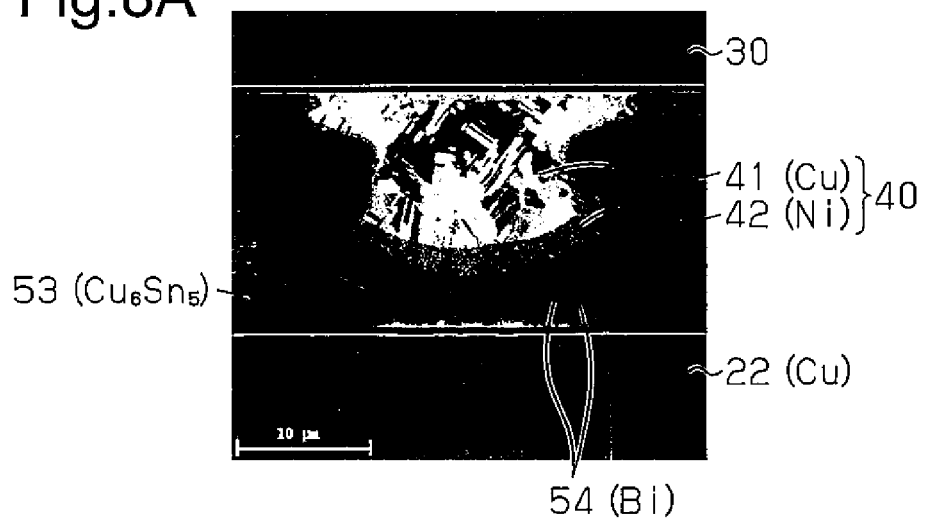
FIGS. 8A to 8C illustrate EPMA analysis results of a joining portion in example 1, where
Figure 8B:
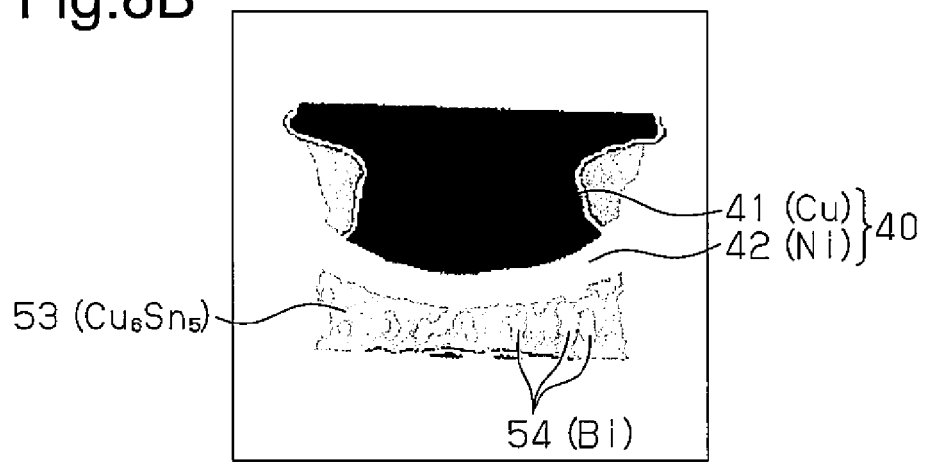
Figure 8C:
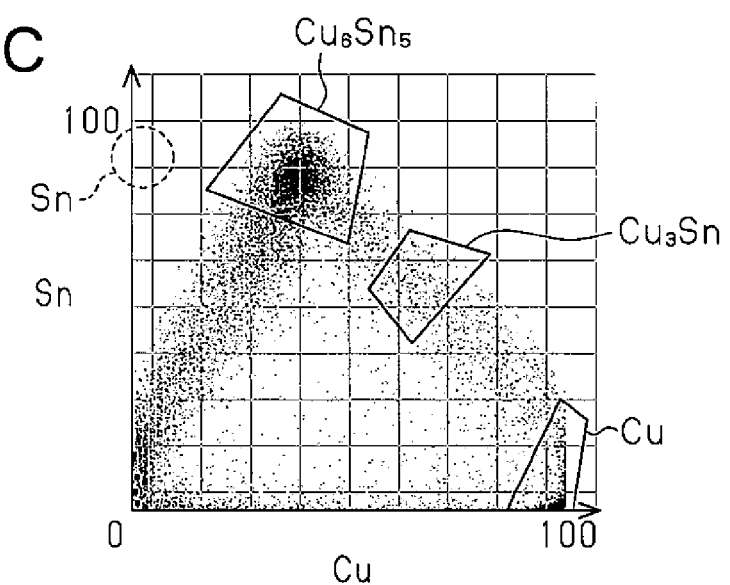

Then, the joining structure of the connection pad P2 and the connection terminal 40 joined in this manner was analyzed with an electron probe microanalyzer (EPMA). FIGS. 8A to 8C illustrate the EPMA analysis results. FIG. 8A illustrates a backscattered electron (BSE) image, FIG. 8B illustrates a phase diagram, and FIG. 8C illustrates a Cu—Sn scatter diagram.

It can be confirmed from the BSE image illustrated in FIG. 8A that the reflow process ensures connection of the connection terminal 40 to the wiring pattern 22. Further, it can be confirmed from the phase diagram of FIG. 8B that the portion joining the wiring pattern 22 (connection pad P2) and the connection terminal 40 is formed from the intermetallic compound of $Cu_6Sn_5$ and the simple substance of Bi. Additionally, it can be confirmed from the phase diagram that the metal bodies 54, which are composed of the simple substance of Bi, are surrounded by the intermetallic compound layer 53, which is composed of intermetallic compounds of $Cu_6Sn_5$. Moreover, it can be confirmed from the Cu—Sn scatter diagram illustrated in FIG. 8C that the portion joining the connection pad P2 and the connection terminal 40 includes a Cu phase, a $Cu_3Sn$ phase, and a $Cu_6Sn_5$ phase but does not include an Sn phase (refer to circle illustrated by broken line). In other words, it can be confirmed that all of the Sn existing in the solder plating layer 60 is consumed to form the intermetallic compound of $Cu_6Sn_5$ or the like.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a wiring substrate including a connection pad;
a joining member joined with the connection pad; and
a semiconductor chip including a connection terminal electrically connected to the connection pad via the joining member,
wherein the joining member consists of:
  a first intermetallic compound layer composed of an intermetallic compound of $Cu_3Sn$ or $Ni_3Sn_4$ and formed at a boundary between the connection pad and the joining member,
  a second intermetallic compound layer composed of an intermetallic compound of $Cu_3Sn$ or $Ni_3Sn_4$ and formed at a boundary between the connection terminal and the joining member,
  a third intermetallic compound layer composed of an intermetallic compound of $Cu_6Sn_5$ or $(Cu,Ni)_6Sn_5$ and formed between the first intermetallic compound layer and the second intermetallic compound layer, and
  a plurality of discrete metal grains, each grain of which is composed of a simple substance of Bi, said plurality of discrete metal grains composed of the simple substance of Bi being separated and dispersed in the third intermetallic compound layer, wherein surfaces of each of the discrete metal grains composed of the simple substance of Bi are completely covered by the third intermetallic compound layer so that the discrete metal grains do not form a layer in the third intermetallic compound layer.

2. The semiconductor device according to claim 1, wherein a simple substance of Sn does not exist in the joining member.

3. The semiconductor device according to claim 1, wherein the connection terminal is a rod-shaped metal post.

4. The semiconductor device according to claim 1, wherein the connection terminal includes
  a rod shaped metal post composed of copper or a copper alloy, and
  a metal layer composed of nickel or a nickel alloy and covering a first surface of the metal post.

5. The semiconductor device according to claim 1, wherein the wiring substrate includes
  a wiring pattern that includes the connection pad, and
  a solder resist layer that includes an opening, wherein the opening exposes at least a portion of the wiring pattern as the connection pad.

6. A semiconductor device comprising:
a wiring substrate including a connection pad;
a joining member joined with the connection pad; and
a semiconductor chip including a connection terminal electrically connected to the connection pad via the joining member,
wherein the joining member consists of:
  a first intermetallic compound layer composed of an intermetallic compound of $Cu_3Sn$ or $Ni_3Sn_4$ and formed at a boundary between the connection pad and the joining member,
  a second intermetallic compound layer composed of an intermetallic compound of $Cu_3Sn$ or $Ni_3Sn_4$ and formed at a boundary between the connection terminal and the joining member, and
  a third intermetallic compound layer composed of an intermetallic compound of $Cu_6Sn_5$ or $(Cu,Ni)_6Sn_5$ and formed between the first intermetallic compound layer and the second intermetallic compound layer,
  wherein the third intermetallic compound layer has a sea-island structure that comprises the third intermetallic compound layer constituting a sea part and a simple substance of Bi constituting an island part.

* * * * *